(12) United States Patent
Matsen (10) Patent No.: US 7,928,870 B2
(45) Date of Patent: Apr. 19, 2011

(54) SIGNAL READING SYSTEM

(75) Inventor: Dean C. Matsen, Shoreline, WA (US)

(73) Assignee: Honeywell International Inc., Morristown, NJ (US)

( * ) Notice: Subject to any disclaimer, the term of this patent is extended or adjusted under 35 U.S.C. 154(b) by 10 days.

(21) Appl. No.: 12/034,986

(22) Filed: Feb. 21, 2008

(65) Prior Publication Data

US 2009/0212986 A1 Aug. 27, 2009

(51) Int. Cl.
*H03M 1/00* (2006.01)

(52) U.S. Cl. ......... 341/110; 341/114; 341/143; 341/155

(58) Field of Classification Search .................. 341/155, 341/164–166, 114, 132, 137, 142, 110
See application file for complete search history.

(56) References Cited

U.S. PATENT DOCUMENTS

| | | | |
|---|---|---|---|
| 3,671,876 A | 6/1972 | Oshiro | |
| 3,984,773 A | 10/1976 | Oda | |
| 4,180,777 A | 12/1979 | Yamada et al. | |
| 4,236,253 A | 11/1980 | Onishi et al. | |
| 4,763,207 A | 8/1988 | Podolak et al. | |
| 4,970,582 A | 11/1990 | Scott | |
| 5,355,136 A * | 10/1994 | Katagiri | 341/157 |
| 5,848,040 A | 12/1998 | Tanaka | |
| 5,887,244 A * | 3/1999 | Aldridge et al. | 455/67.14 |
| 6,084,837 A | 7/2000 | Miyanabe et al. | |
| 6,225,936 B1 * | 5/2001 | Silver et al. | 341/157 |
| 6,285,979 B1 * | 9/2001 | Ginzburg et al. | 704/208 |
| 6,473,369 B1 * | 10/2002 | Quan et al. | 369/30.14 |
| 6,631,341 B2 | 10/2003 | Kameda et al. | |
| 6,725,248 B1 | 4/2004 | Hasegawa et al. | |
| 6,781,938 B2 * | 8/2004 | Nanba et al. | 369/59.22 |
| 6,812,875 B2 * | 11/2004 | Shimizu | 341/143 |
| 7,095,803 B2 | 8/2006 | Gazsi et al. | |
| 7,200,187 B2 * | 4/2007 | O'Brien | 375/316 |
| 7,424,066 B2 | 9/2008 | Montalvo et al. | |
| 7,479,907 B2 * | 1/2009 | Lazar | 341/110 |
| 7,623,053 B2 * | 11/2009 | Terry et al. | 341/143 |
| 2003/0112733 A1 * | 6/2003 | Nanba et al. | 369/59.22 |
| 2004/0252044 A1 * | 12/2004 | Mathis et al. | 341/155 |
| 2009/0079607 A1 * | 3/2009 | Denison et al. | 341/143 |

OTHER PUBLICATIONS

Steven W. Smith, "The Scientist and Engineer's Guide to Digital Signal Processing," pp. 319-332, 2007.

* cited by examiner

*Primary Examiner* — Linh V Nguyen (74) *Attorney, Agent, or Firm* — Seager, Tufte & Wickhem LLC (57) ABSTRACT

A signal reader system having a processor for reconstructing a relatively high-frequency input signal to a low-pass filter from an output of the filter based on a characterization of the filter. The characterization may be adapted to compensate for filter output changes due to temperature. A signal reader may be connected to the output of the processor to determine certain things, such as a pulse count, about the filter input signal.

6 Claims, 12 Drawing Sheets

SIGNAL READING SYSTEM

BACKGROUND

The invention pertains to signal processing, and particularly to reconstructive signal processing.

SUMMARY

The invention is a system for reading high-frequency pulses through a low-pass filter.

DESCRIPTION

The present invention is an approach for using an analog input from which a pulse count may be obtained indirectly. The input signal to a low-pass filter of the present approach cannot realistically be used for the count in absence of additional hardware to pick up the signal. Additional hardware means undesired expense. In the present approach, pulse counting of the input may be achieved without adding any hardware specific to counting, like a second path for the input signal, which could be a high frequency path around the filter. In the present approach, the input signal may be reconstructed after the filter. This approach appears to work even if there is a resistor-capacitor (RC) filter in the analog input hardware that severely attenuates frequencies in the range of which pulses are to be counted. The present approach may essentially include reading high frequency pulses coming through a strong low-pass filter.

Pulse counting hardware may be different from analog input hardware partially because the bandwidth needed for pulse counting appears to be in conflict with the low-pass filtering requirements of an analog input.

At a highest level, the present approach may operate by nearly exactly reconstructing the original signal being input to the RC filter. This approach may appear workable in a manner contrary to normal intuition. Further, it may be done more simply than intuition would suggest. The present approach may be done without accumulating any state information except for a previous sample value. This may eliminate the possibility of long term round off, drift, or instability. It also means that the present approach may work accurately at arbitrarily low frequencies.

Other approaches may include specific inputs that count pulses, but are not capable of doing any analog-to-digital conversion, and do not share terminals with analog input hardware. This generally adds costs to the product because more hardware appears to be required.

Still other approaches may include sharing the same input terminals between an analog input and pulse-counting input, but ultimately have the signal go through two different paths. This appears to be basically the same as having dedicated pulse-counting hardware, except that the terminals are shared with analog input hardware. Once again, these approaches may involve added costs for the pulse counting capability.

The present pulse counting approach may include an input block for providing biasing and filtering. The present counting approach may be shown with an example which involves re-engineering a pulse counting algorithm using a low-pass RC filter on the input.

It may be noted that by doing a computation on the differences between consecutive A/D readings, pulses through an RC filter could be counted. But there may be some difficulties with using a fixed threshold; however, it appears that some sort of relatively simple incremental state-maintaining algorithm might accomplish the task of counting pulses. Whatever algorithm is to be used, it should be simple, run at about 640 Hz, and do computations for up to three channels for certain product needs, but there may be more or less channels.

One may consider the following example, in which a 100 Hz square wave is presented at the input immediately following the tail end of a very long square wave. If one were to set a fixed threshold at 512 Hz, the system would miss the first two pulses following the long pulse. However, this could possibly be alleviated by having a moving threshold. For instance, the threshold may simply be the output of a low-pass IIR (infinite impulse response) filter with a lower frequency than the RC filter itself (but not so low that the threshold would fail to keep up with the special case shown herein). However, if the threshold reacts fast enough for such case, one's intuition may indicate that it would not function properly over the other extreme case of a ten minute long square wave (i.e., it would tend to follow such a long square wave too closely).

Ultimately, one thing that may indicate having the wrong solution is a situation where the input is a ten minute line sine wave. Then the slowly-moving-threshold approach would appear to simply follow the sine wave and not provide a useful threshold point at all. One might argue that responding to a sine wave is not needed, but one may have to admit that certain designs do respond to a sine wave.

A goal is to cancel out the effects of the RC filter. If one designed a system that accomplished a cancellation of such effects, it might be unstable (which is often a concern with IIR filters) or require too much computation if done at 640 Hz. However, it may be noted that not only can such design be safely done with integer-only math; it may be implemented without any feedback (meaning that it would not get out of sync or become unstable). The only state variable in this designed system would be a previous A/D reading.

The design of the system may begin with a characterization the low-pass RC filter as an IIR filter in order to get its constants. A form of a single-pole IIR filter may be:

$$y_n = a_0 x_n + b_1 y_{n-1}. \quad (1)$$

Figure 2:
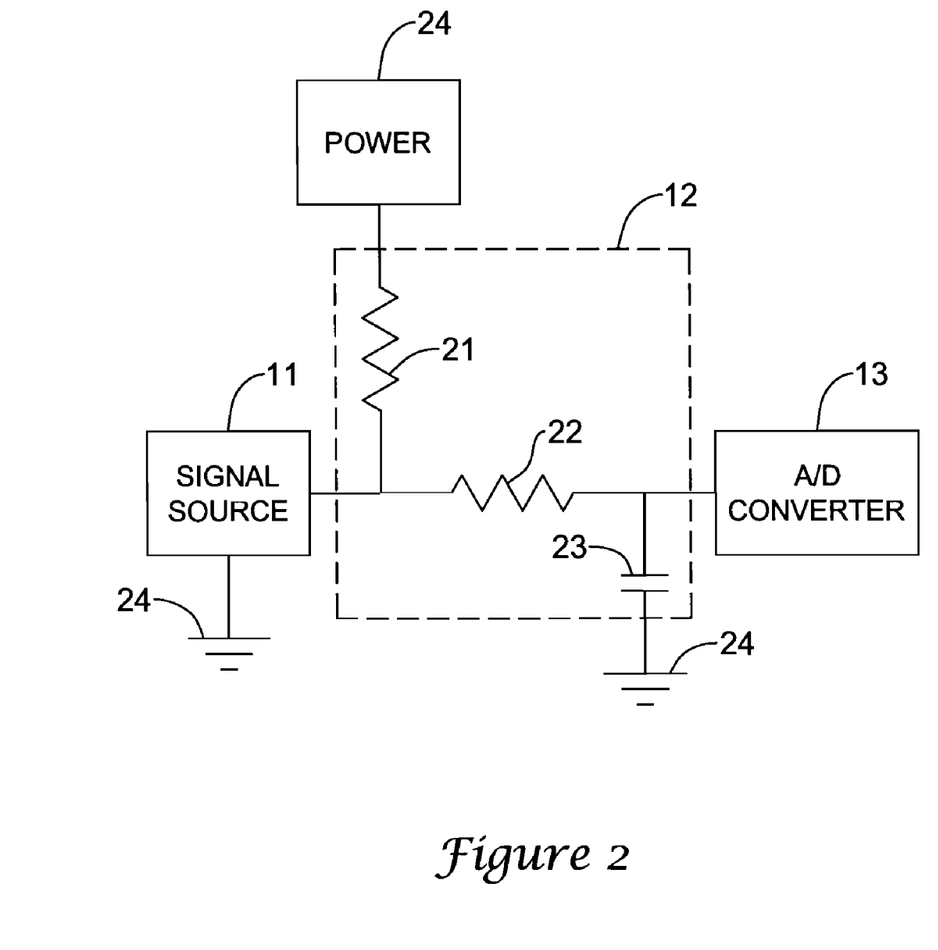
FIG. 2 is a schematic diagram of a low-pass filter in the system.

The constants for this equation may be computed as:

$$b_1 = e^{-2\pi f_c} \text{ and}$$

$$a_0 = 1 - b_1$$

where $f_c$ is expressed as a fraction of the sample rate of the analog-to-digital converter, i.e., $f_c = (-3 \text{ dB point})/(\text{sample rate})$. The RC filter of the input block 12 may have a $-3$ dB point of $1/(2*\pi*\tau*C) = 1/(2*\pi*34000*0.00000047) \cong 10$ Hz, where $\tau$ is the time constant of the filter. Thus, $f_c = 10/640$. At a sample rate of 640 Hz, this may be simulated as $$b_1 = e^{-2\pi(10/640)} = 0.9064905$$

$$a_0 = 0.0935095$$

By solving the equation (1) for $x_n$, one may get $$x_n = (1/a_0) y_n - (b_1/a_0) y_{n-1} = 10.694 y_n - 9.694 y_{n-1}.$$

It may be noted that the computation of $x_n$ seems to just depend on two consecutive A/D readings. Since there appears to be no possibility of accumulated errors, the following equation is nearly as good.

$$x_n = 11 y_n - 10 y_{n-1} \quad (2)$$

A critical thing here is that the two constants are different from each other by virtually exactly one (in this instance, 11−10=1). Since the $x_n$ is a reconstruction of the original waveform, ranging from 0 to 1023 (in a 10-bit A/D case); an absolute threshold (e.g., around 512) for the 10-bit A/D may be used. It may be noted that the $x_n$ resulting from equation (2) is specific to the parameters of the filter and the sample rate. The 640 Hz sampling rate, which can be optional, may be regarded as integral to the 50/60 Hz of common power lines, and thus helpful in rejecting 50/60 Hz noise at the input side of the A/D converter.

The low-pass filter may be a multiple-pole filter and a corresponding characterization may be provided and implemented in a similar manner as the characterization provided herein for the single-pole low-pass filter.

Figure 1:
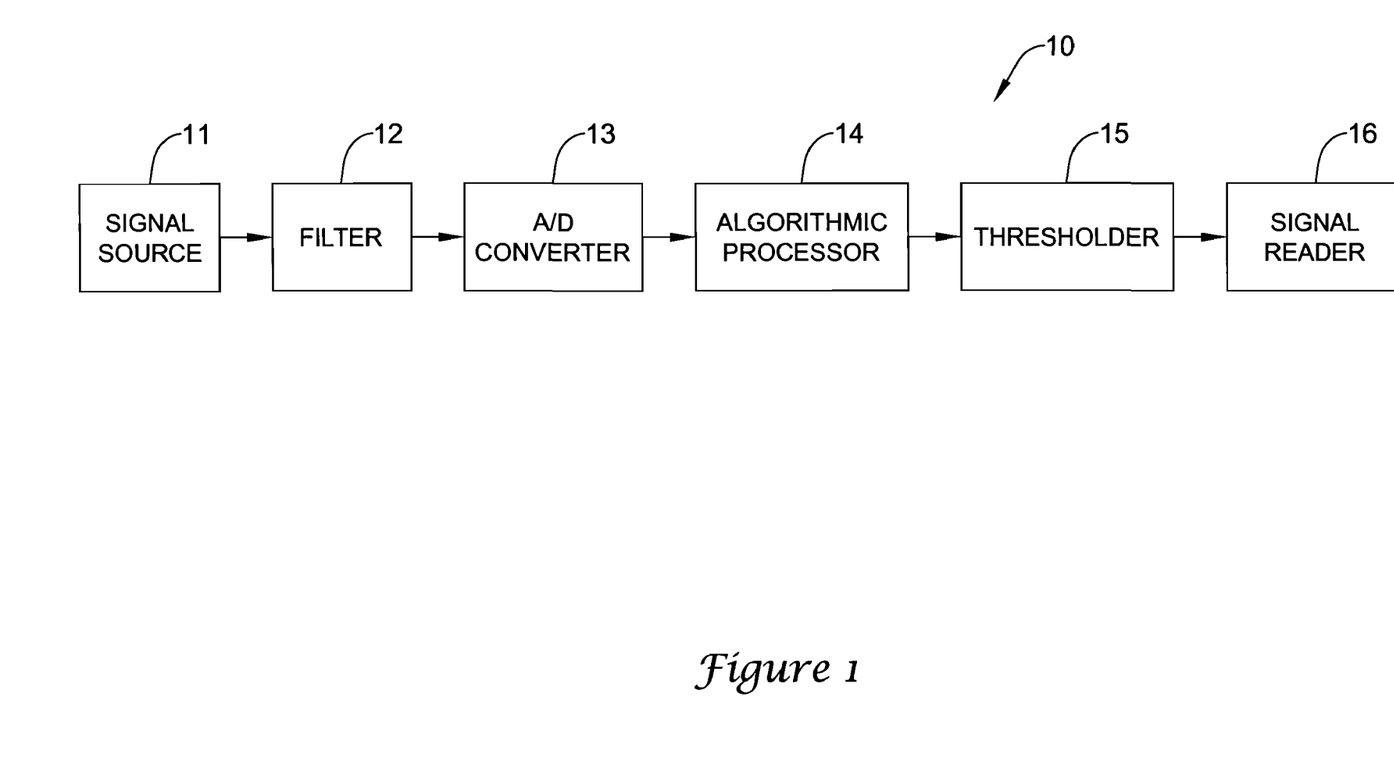
FIG. 1 is a block diagram of a signal reader system.

FIG. 1 is a block diagram of the present system 10 applicable to pulse counting. A signal or pulse source 11 may provide an output to an RC filter 12. An output of filter may go to an input of an analog-to-digital (A/D) converter (ADC) 13. ADC 13 may provide an output to an algorithmic processor 14. The signal may be processed according to the algorithm described herein (i.e., equation (1)). Also, the algorithm may be adapted for compensating temperature drifts of filter 12. Processor 14 may be used for reconstructing an input signal to filter 12. ADC 13 and processor 14 may be regarded together as a signal reconstructor. The output of processor 14 may go to a signal thresholder 15. The thresholder 15 may condition signals from the processor 14 into digitally-formed or pulse-like shaped signals. From thresholder 15, the output signals may be provided to a signal reader 16 having a counter for counting pulses. For certain kinds of signals, processor 14 might be directly connected to the signal reader 16.

FIG. 2 shows the low-pass RC filter 12 having an output connected to the input of ADC 13. An input signal may be provided by a signal or pulse source 11 to filter 12 at a common connection of resistors 21 and 22. Resistor 21 may have a value of about 10K ohms and resistor 22 may have a value of about 100K ohms. The other ends of resistors 21 and 22 may be connected to a power source 24 and a capacitor 23, respectfully. Capacitor 23 may have a value of about 0.47 microfarads. The indicated values of the resistors and capacitor are examples but could be other values. The output of filter 12 may be at the common connection of resistor 22 and capacitor 23 which may go to the input of the ADC 13. A reference voltage of the various components of system 10 may be a ground 24.

Figure 3:
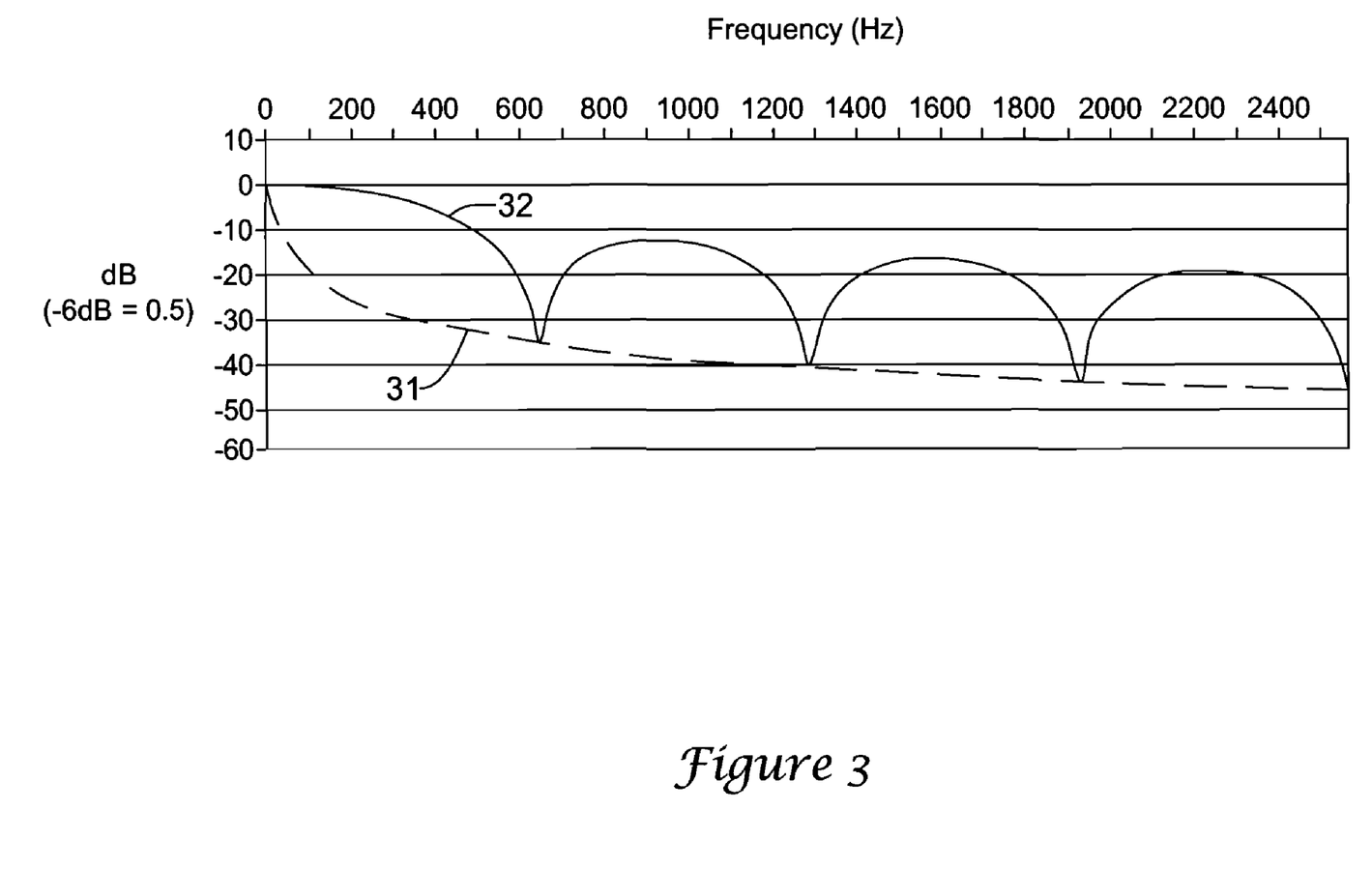
FIG. 3 is a graph of a response of the low-pass filter plus a reconstruction filter.
Figure 4:
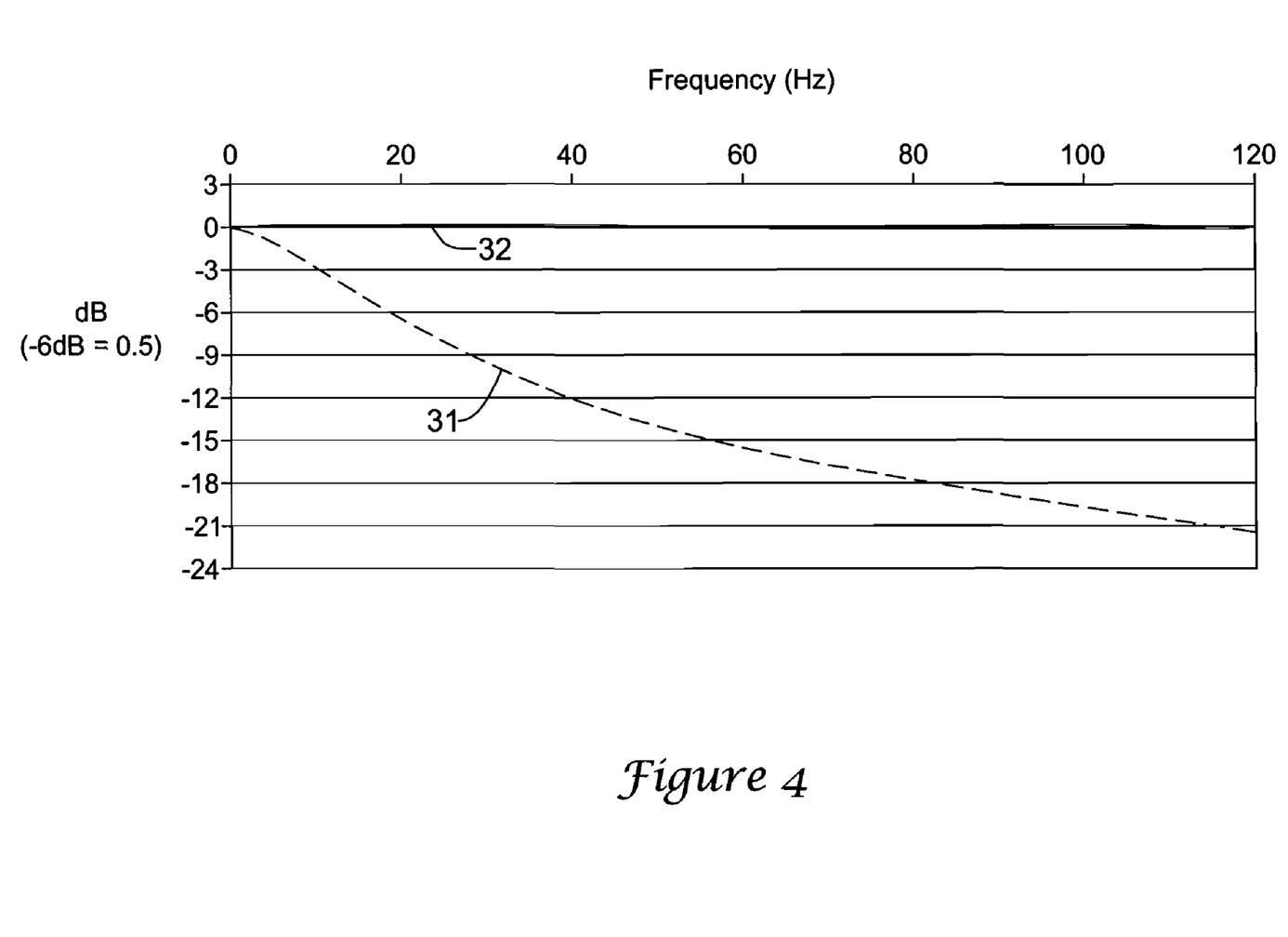
FIG. 4 is a graph showing a closer view of a portion of the graph in FIG. 3.

The frequency response of the RC filter 12 plus the response of reconstruction filter (using 10 and 11 as constants—equation (2)) in the processor 14 is shown as curve 32 in the graph of FIG. 3. In the range from 0 to 100 Hz, the overall reconstructed response 32 may appear very nearly ideal, as shown in FIG. 4. FIG. 4 may effectively be a zoomed-in version of the graph in FIG. 3, from zero to 120 Hz. Plot 31 may be a response of just the RC filter 12. The graphs of FIGS. 3 and 4 show plots in terms of dB (−6 dB=0.5) versus frequency.

Relative to the 640 Hz sampling scenario, one concern may be that there is a high response around 920 Hz, with the overall attenuation being only about 13 dB. 920 Hz may be aliased to 280 Hz. The next such high response point may be near 1575 Hz, at about 17 dB attenuation. 1575 Hz may alias to 295 Hz. Both of these aliased frequencies appear outside the 0 to 100 Hz range. Such high-frequency noise could occur due to contact bouncing, making this a legitimate concern.

The situation might be improved with a 100 Hz low pass filter after the reconstruction filter, but a single-pole low pass filter seems not strong enough (in that 100 Hz appears too close to the middle of the 640 Hz spectrum). A higher order filter could be probably too CPU intensive to implement at such a high rate.

A solution may be to set hysteresis or threshold points at ¾-full-scale and ¼-full-scale, so that a full-amplitude signal with 13 dB of attenuation (i.e., about one quarter amplitude) gets rejected.

Figure 5:
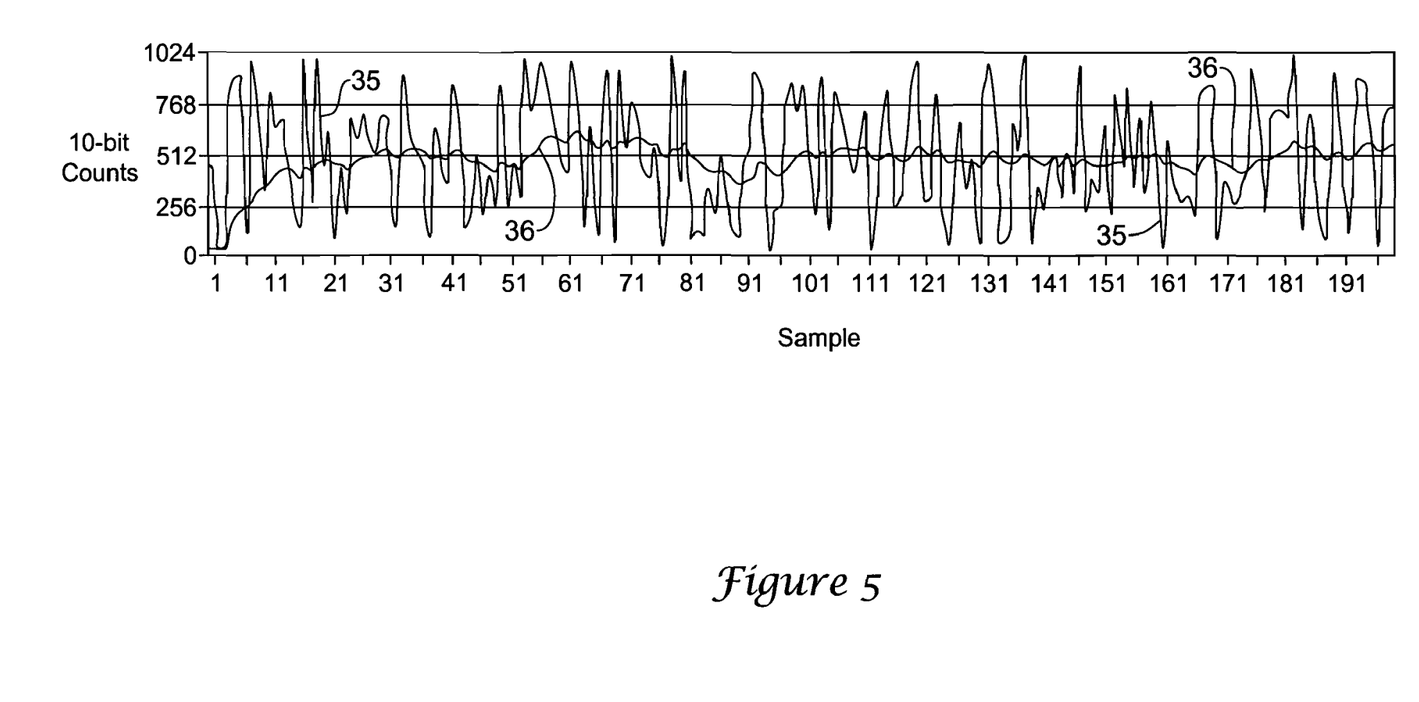
FIG. 5 is a graph of an input and output signals of the low-pass filter.
Figure 6:
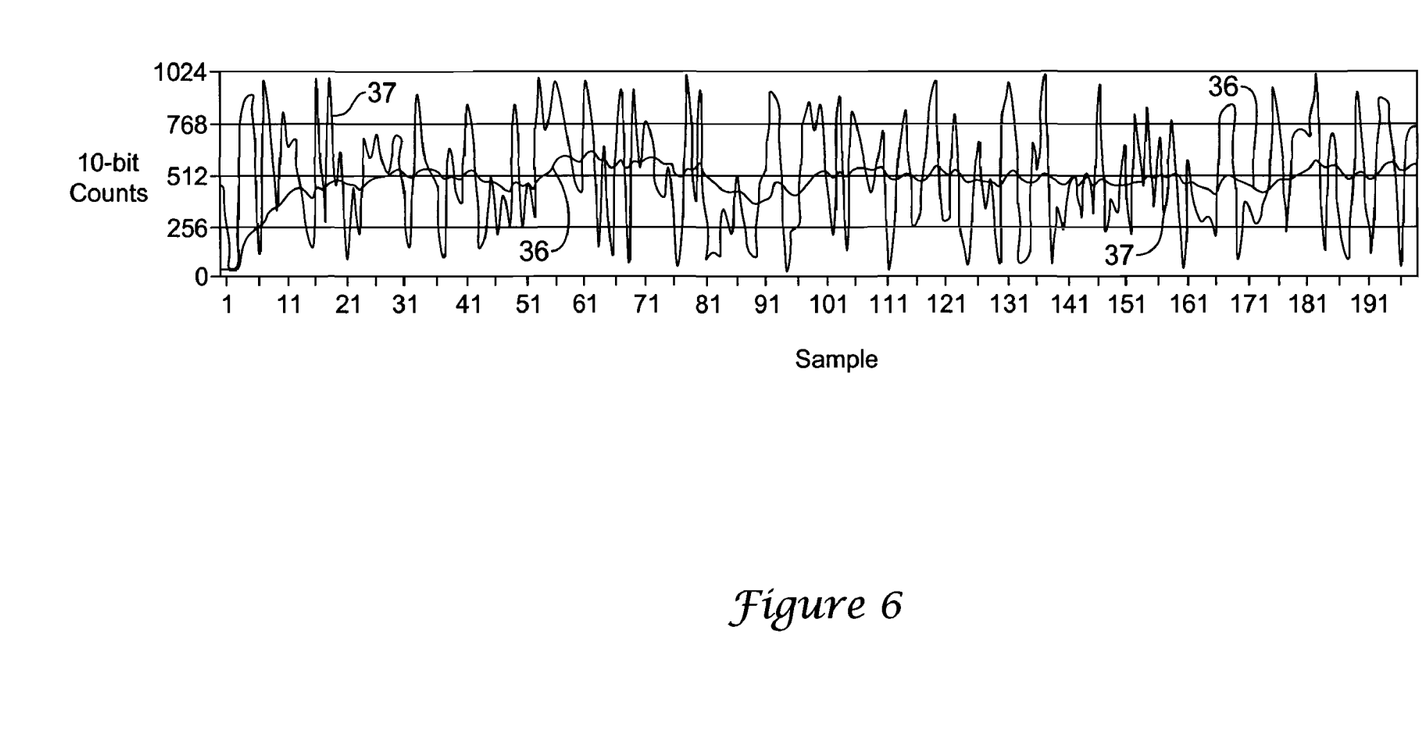
FIG. 6 is a graph of the low-pass filter output signal and a reconstructed input signal of the filter.

Test or simulation results may be noted. An input test using random noise may be done to see if the reconstruction IIR filter is unstable in the face of noise. Such test was done before it was realized that the filter appeared not to be an IIR filter, but rather an FIR (finite impulse response) filter of a length 2, and thus would not become unstable. A distinguishing aspect of the FIR filter may be a lack of $x_{n-1}$ in equation (1). FIG. 5 is a graph of the test on a basis of 10-bit counts versus sample number. Line 35 is a plot of the raw input to an RC filter 12 and line 36 represents an output of the RC filter (an A/D 13 input). FIG. 6 is a graph which shows a reconstructed filter input in terms of 10-bit counts versus sample number. A line 37, representing a reconstruction of the original input, may be generated directly from an RC filter 12 output (an A/D or ADC 13 input) signal represented by line 36 in the graph.

Figure 7:
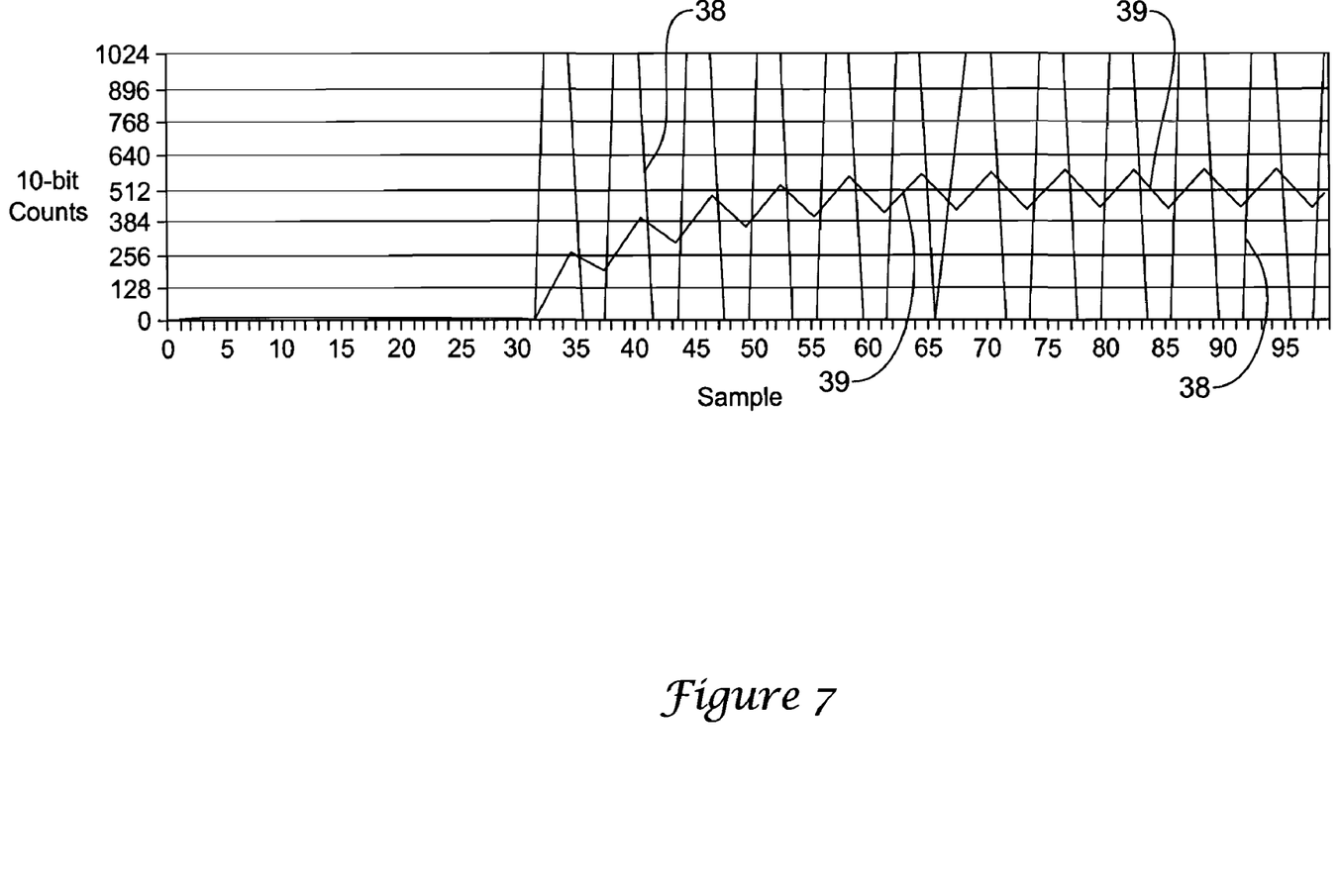
FIG. 7 is a graph of input and output signals of the low-pass filter for a very low frequency wave followed by a higher frequency.
Figure 8:
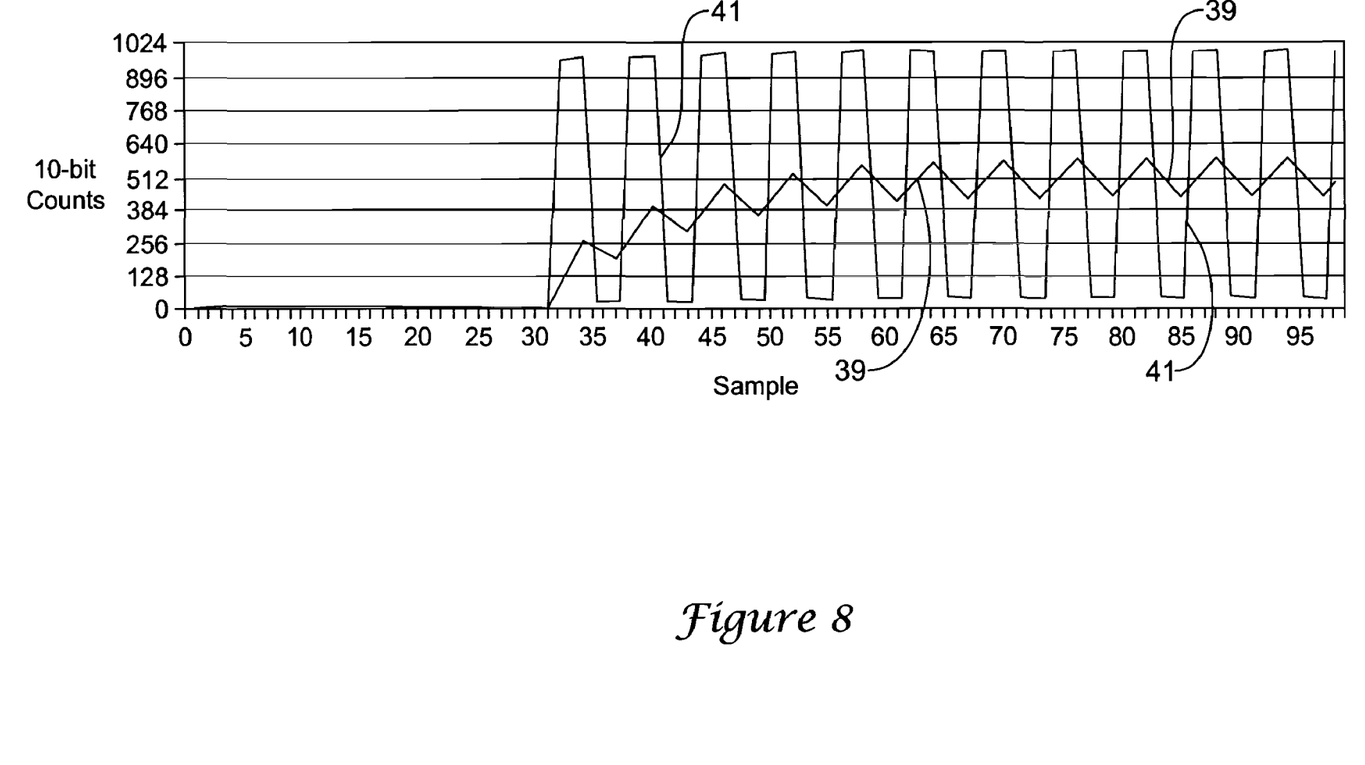
FIG. 8 is a graph the low-pass filter output signal and a reconstructed input signal to the filter for the very low frequency wave followed by a higher frequency.

FIG. 7 is a graph where a very low frequency wave is followed by 100 Hz. Line 38 represents a raw input and line 39 represents an RC filter 12 output (an A/D input). FIG. 8 is a graph that shows a reconstruction of the raw input in FIG. 7. Line 41 in FIG. 8 represents the reconstruction of the original waveform and line 39 represents the RC filter output (A/D input). One may note that the reconstructed signal 41 appears attenuated a little bit, which is probably due to a rounding off of the filter constants.

Figure 9:
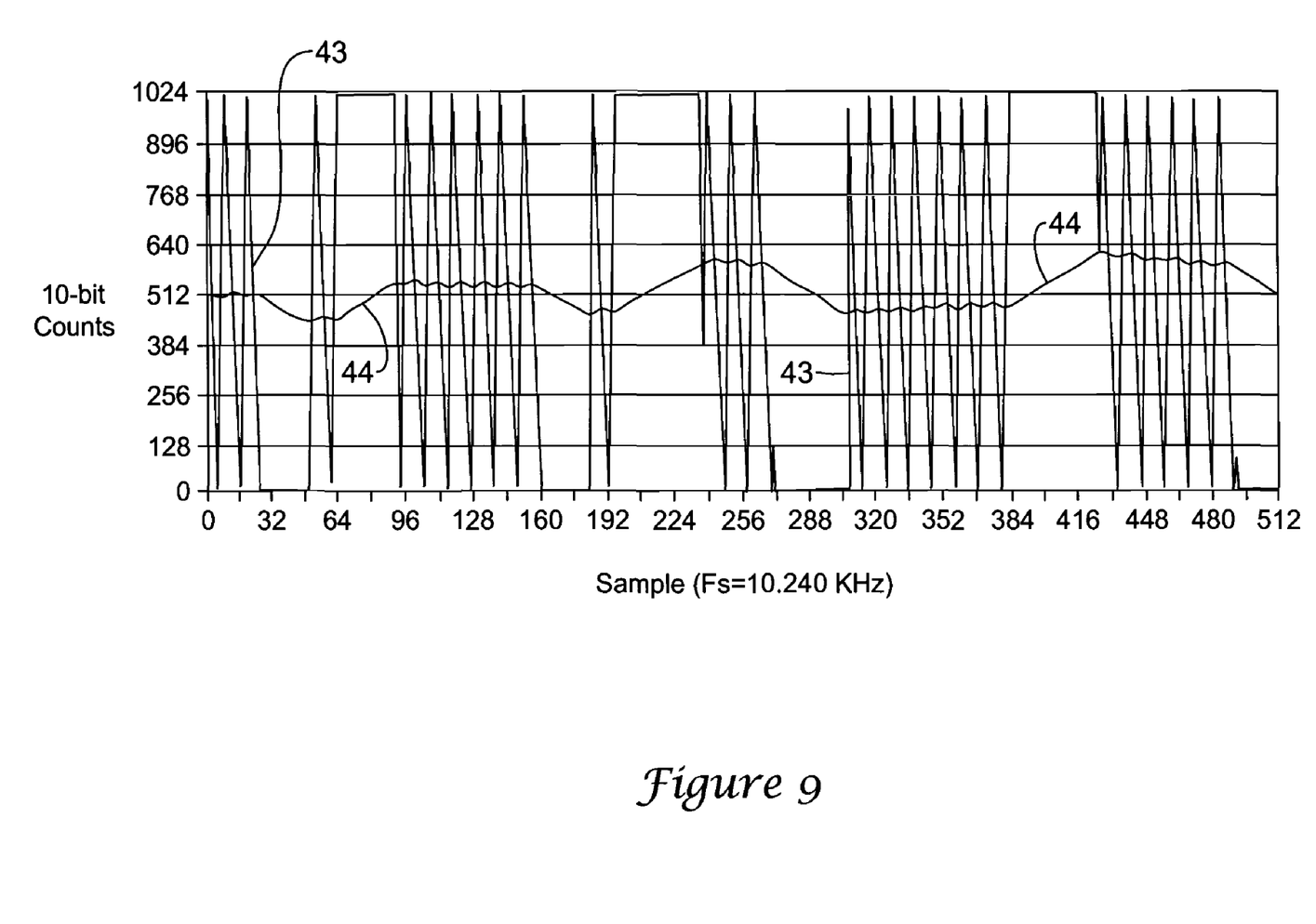
FIG. 9 is a graph showing a reconstruction of a worst-case scenario of a low-pass filter input having sinusoidal noise at a certain frequency in transitions between high and low, and showing the filter output.
Figure 10:
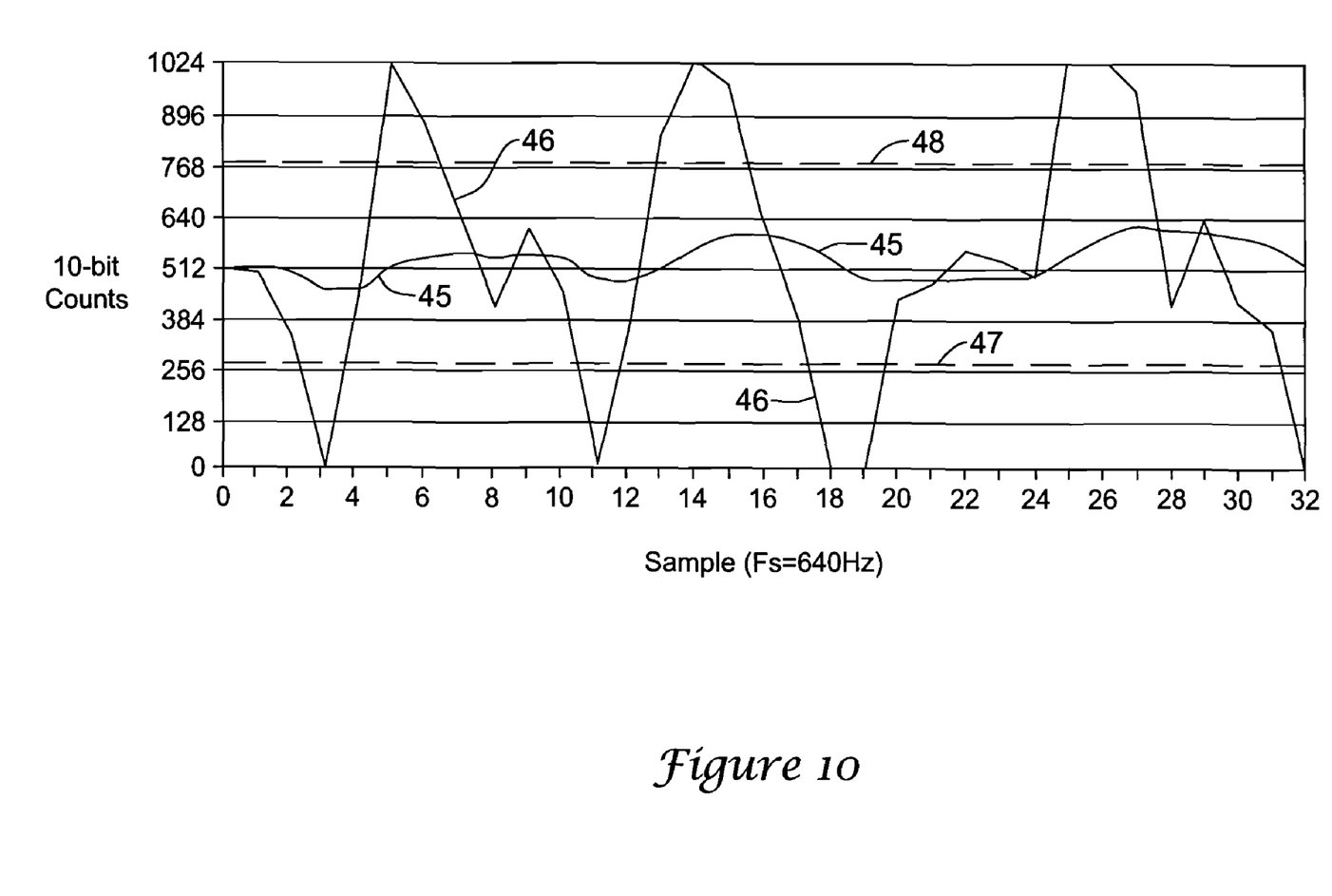
FIG. 10 is a graph showing the low-pass filter output in the graph of FIG. 9 decimated by a certain factor, and showing a reconstruction of the filter input along with low and high thresholds.

Noise rejection may be noted. The graph of FIG. 9 shows an attempt to reconstruct the worst-case scenario of having virtually an exact 930 Hz of sinusoidal noise in the transitions from high to low. This simulation may be done at 10.240 KHz so that the effects of the RC filter 12 can be replicated appropriately. The graph of FIG. 9 shows 10-bit counts versus sample number with sample frequency at 10.240 KHz. The noise may be simulated at 10.240 KHz. The raw data input is represented by line 43 and the RC filter 12 output is represented by line 44 in the graph of FIG. 9. The RC output in the graph of FIG. 9 may be decimated by a factor of 16, leading to line 45 representing the RC output (A/D input) in the graph of FIG. 10. The graph of FIG. 10 shows 10-bit counts versus sample number with a sample frequency of 640 Hz. The decimation factor x16 may simulate the 640 Hz sampling with its aliasing implications. In this case, the 930 Hz sine wave may be aliased down to 290 Hz. One may note how the line 45 (RC output) in the graph of FIG. 10 hardly shows the input noise, yet the reconstruction filter (i.e., algorithmic processing of processor 14) produces a reconstruction, as indicated by line 46, of the original wave having a 290 Hz signal near samples 8 to 10, and also near samples 28 to 31. This appears to be because of the "hump" in the frequency response near 930 Hz. As expected, however, this signal may be attenuated enough so that it does not go outside the ¼ and ¾ thresholds, as shown by lines 47 and 48, respectively. Thus, this signal or noise may be rejected by a threshold/hysteresis algorithm of thresholder 15.

Figure 11:
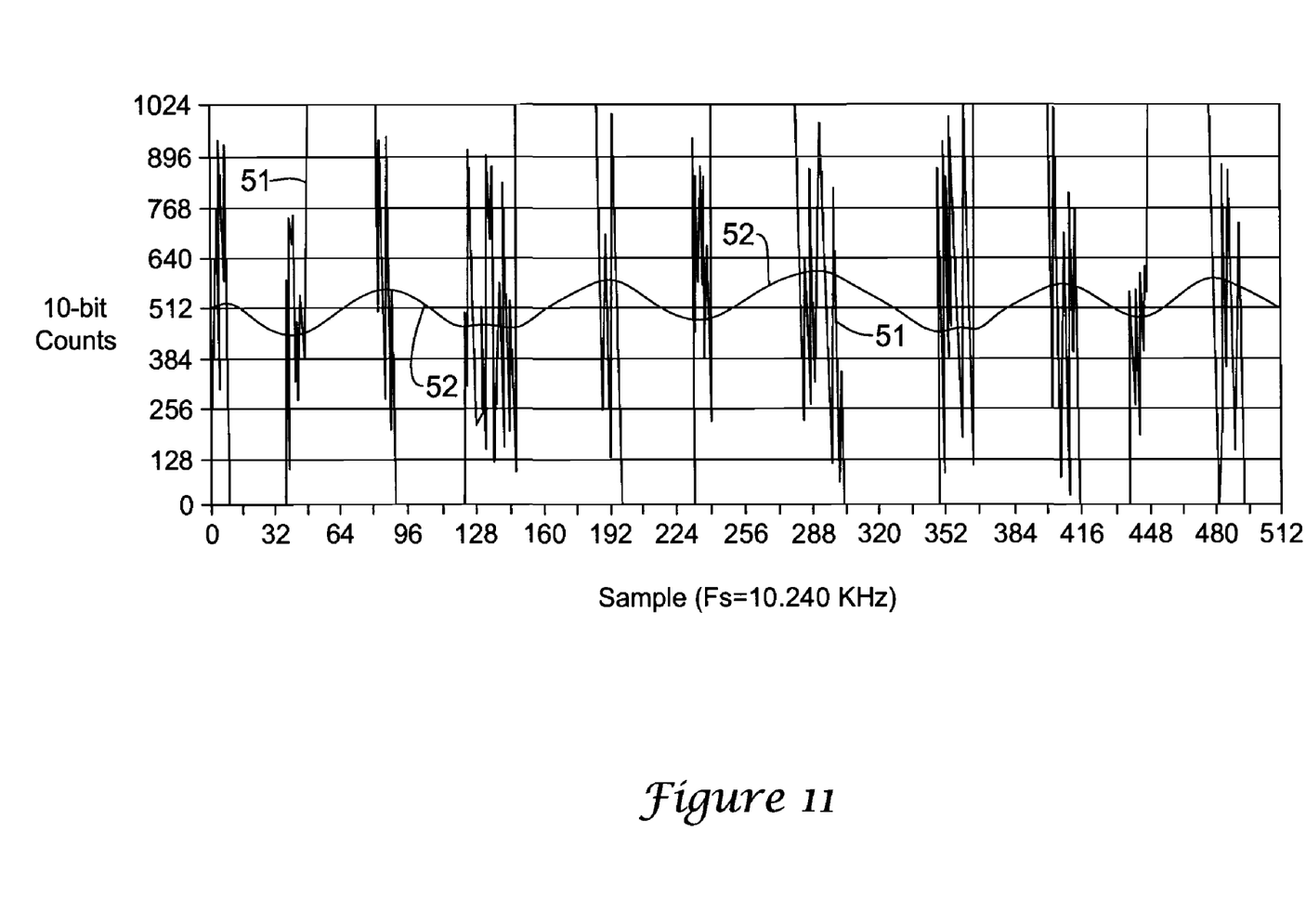
FIG. 11 is a graph showing a reconstruction of a worst-case scenario of a low-pass filter input having white noise in transitions between high and low, and showing the filter output.
Figure 12:
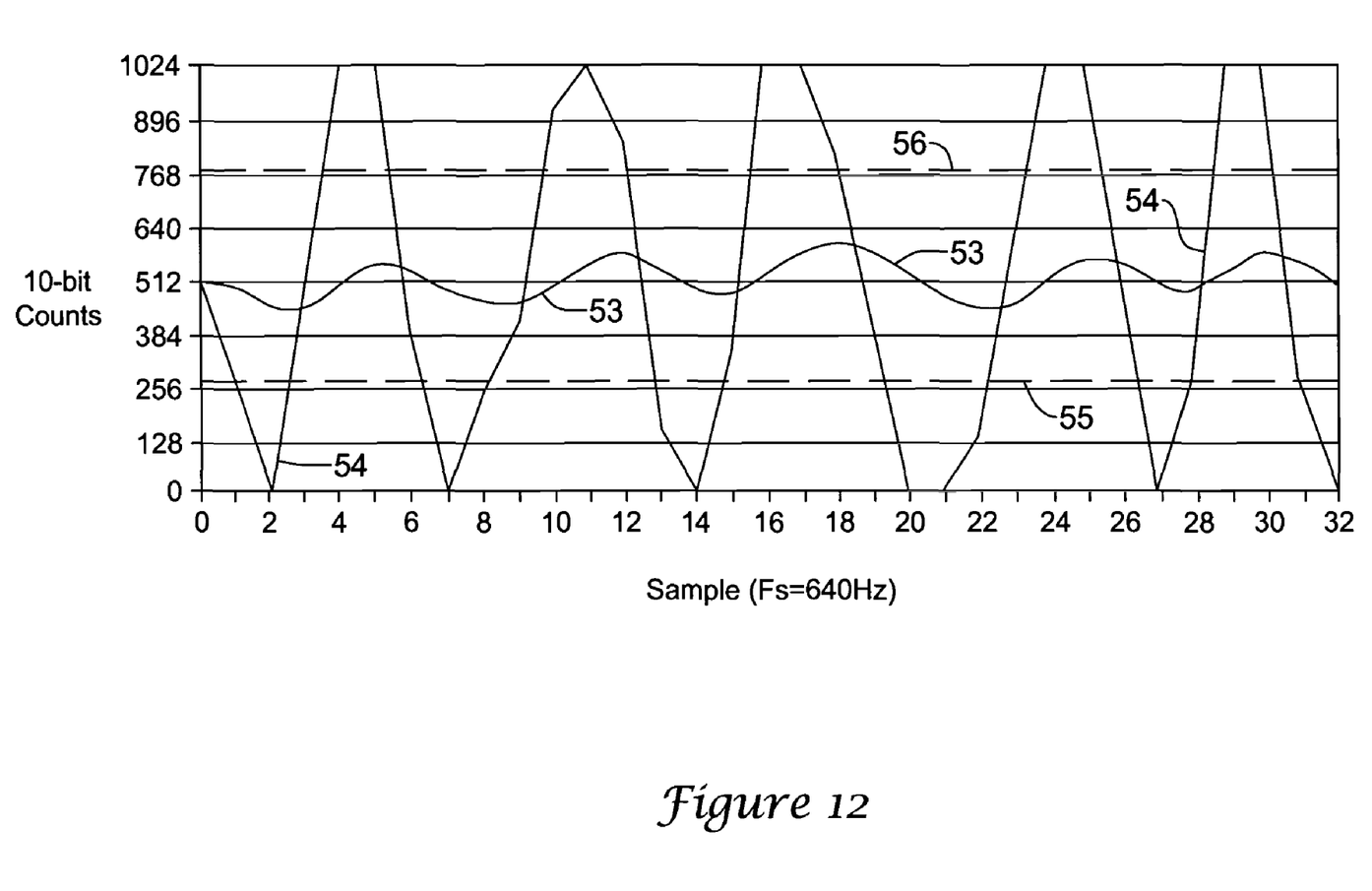
FIG. 12 is a graph showing the low-pass filter output in the graph of FIG. 11 decimated by a certain factor, and showing a reconstruction of the filter input along with low and high thresholds.

Another realistic simulation may be provided in a graph of FIG. 11. The graph of FIG. 11 shows 10-bit counts versus sample number with a sampling frequency at 10.240 KHz. The noise may be simulated at 10.240 KHz. Line 51 represents the raw input and line 52 represents the output of RC filter 12. White noise may appear in the transitions. This graph appears to show performance better than the 930 Hz case because the white noise has a more spread out spectrum. The input may be reconstructed in a graph of FIG. 12. The graph of FIG. 12 shows 10-bit counts versus sample number with a sampling frequency at 640 Hz. Line 53 represents the RC filter 12 output (ADC 13 input) and line 54 represents a reconstruction of the original waveform of the filter 12 input. Lines 55 and 56 represent upper and lower thresholds, respectively.

In the present specification, some of the matter may be of a hypothetical or prophetic nature although stated in another manner or tense.

Although the invention has been described with respect to at least one illustrative example, many variations and modifications will become apparent to those skilled in the art upon reading the present specification. It is therefore the intention that the appended claims be interpreted as broadly as possible in view of the prior art to include all such variations and modifications.

What is claimed is:

1. A pulse counting system comprising:
a filter;
an analog-to-digital converter connected to the filter;
an algorithmic processor connected to the analog-to-digital converter; and
a pulse counter connected to the algorithmic processor;
wherein:
the algorithmic processor is configured to reconstruct an input signal of the filter;
the algorithmic processor is configured to apply an algorithm to provide a characterization of the filter to reconstruct the input signal; and
the characterization of the filter comprises:

$$y_n = a_0 x_n + b_1 y_{n-1};$$

$$b_1 = e^{-2\pi f_c}; \text{ and}$$

$$a_0 = 1 - b_1; \text{ and}$$

wherein $f_c$ is a −3 dB point of the filter divided by a sample rate of the analog-to-digital converter.

2. The system of claim 1, wherein $x_n$ is a reconstruction of the input signal to the filter.

3. The system of claim 2, further comprising a thresholder connected between the algorithmic processor and the pulse counter.

4. The system of claim 2, wherein the characterization of the filter is adapted for compensating temperature drifts of the filter.

5. A method for counting pulses comprising:
processing an output signal from a filter to obtain a reconstruction of an input signal to the filter; and
counting pulses of the reconstruction of the input signal; and
wherein:
the reconstruction of the input signal is according to an algorithm;
the algorithm is a characterization of the filter; and
the characterization of the filter comprises:

$$y_n = a_0 x_n + b_1 y_{n-1};$$

$$b_1 = e^{-2\pi f_c}; \text{ and}$$

$$a_0 = 1 - b_1; \text{ and}$$

wherein:
$f_c$ is a −3 dB point of the filter divided by a sample rate of the analog-to-digital converter; and
$x_n$ is a reconstruction of the input signal to the filter.

6. A signal reader system comprising:
a filter;
a signal reconstructor connected to the filter; and
a signal reader connected to the signal reconstructor; and
wherein:
the signal reconstructor reconstructs an input signal of the filter;
the signal reconstructor comprises:
an analog-to-digital converter connected to the filter; and
an algorithmic processor connected to the analog-to-digital converter and the signal reader;
the algorithmic processor is for applying an algorithm to provide a characterization of the filter for reconstructing the input signal; and
the algorithm comprises:

$$y_n = a_0 x_n + b_1 y_{n-1};$$

$$b_1 = e^{-2\pi f_c}; \text{ and}$$

$$a_0 = 1 - b_1; \text{ and}$$

wherein:
$f_c$ is a −3 dB point of the filter divided by a sample rate of the analog-to-digital converter; and
$x_n$ is a reconstruction of the input signal to the filter.

* * * * *